(12) United States Patent
Dalgaty et al.

(10) Patent No.: US 12,136,022 B2
(45) Date of Patent: Nov. 5, 2024

(54) METHOD OF TRAINING A LOGISTIC REGRESSION CLASSIFIER WITH A RESISTIVE RANDOM ACCESS MEMORY

(71) Applicant: COMMISSARIAT A L'ENERGIE ATOMIQUE ET AUX ENERGIES ALTERNATIVES, Paris (FR)

(72) Inventors: Thomas Dalgaty, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 815 days.

(21) Appl. No.: 16/950,156

(22) Filed: Nov. 17, 2020

(65) Prior Publication Data

US 2021/0150409 A1    May 20, 2021

(30) Foreign Application Priority Data

Nov. 20, 2019   (EP) .................................... 19210420

(51) Int. Cl.
*G06N 20/00*     (2019.01)
*G11C 13/00*    (2006.01)

(52) U.S. Cl.
CPC ........... *G06N 20/00* (2019.01); *G11C 13/004* (2013.01); *G11C 13/0069* (2013.01); *G11C 2013/0045* (2013.01)

(58) Field of Classification Search
CPC combination set(s) only.
See application file for complete search history.

(56) References Cited

FOREIGN PATENT DOCUMENTS

CN        110516699 A  * 11/2019 ............. G06F 17/18

OTHER PUBLICATIONS

European Search Report dated May 12, 2020 in European Application 19210420.6 filed on Nov. 20, 2019, 1 page.
Groenewald et al., "Bayesian computation for logistic regression", Computational Statistics & Data Analysis, vol. 48, No. 4, XP027662479, Apr. 1, 2005, pp. 857-868.
Malhotra et al., "Exploiting Oxide Base Resistive RAM Variability for Probabilistic AI Hardware Design", XP055693207, Nov. 16, 2019, 4 pages.
Ankit et al., "PUMA: A Programmable Ultra-efficient Memristor-based Accelerator for Machine Learning Inference", Architectural Support For Programming Languages and Operating Systems, ACM, XP058433490, Apr. 4, 2019, pp. 715-731.

(Continued)

*Primary Examiner* — Alexander Sofocleous
*Assistant Examiner* — Jared Micahl McDuffey
(74) *Attorney, Agent, or Firm* — Oblon, McClelland, Maier & Neustadt, L.L.P.

(57) ABSTRACT

A method for training a logistic regression classifier on a dataset by using a resistive RAM as hardware accelerator, each row of the resistive RAM including cells which can be programmed in a first resistance state or a second resistance state. The probability of a data element belonging to a class is modelled by a logistic function applied to a score of the element, where is a parameter vector of the model. The logistic regression classifier is trained by populating the resistive RAM with samples of a model parameter vector which are obtained by MCMC sampling. Once populated, the resistive RAM can be used for classifying new data.

11 Claims, 7 Drawing Sheets

(56) References Cited

OTHER PUBLICATIONS

Rogers et al., "First course in Machine Learning", Chapter 4, second edition, Chapman & Hall/CRC Press, 2017, 29 pages.
Andrieu et al., "An Introduction to MCMC for Machine Learning", Machine Learning, 50, 2003, pp. 5-43.
Carboni et al., "Stochastic Memory Devices for Security and Computing", Advanced Electronic Materials, 5, 1900198, pp. 1-27.

* cited by examiner

METHOD OF TRAINING A LOGISTIC REGRESSION CLASSIFIER WITH A RESISTIVE RANDOM ACCESS MEMORY

FIELD OF THE INVENTION

The present invention concerns the field of machine learning and more specifically the use of Markov Chain Monte Carlo (MCMC) sampling for machine learning. The invention also relates to the field of resistive Random Access Memories (RRAMs).

BACKGROUND OF THE INVENTION

Classification is a common problem within machine learning. Basically, classifying amounts to predicting a qualitative response for an observation i.e. assigning the observation to a category or a class. Many classification techniques are available to predict a qualitative response. A very popular supervised classification method is logistic regression.

Figure 1:
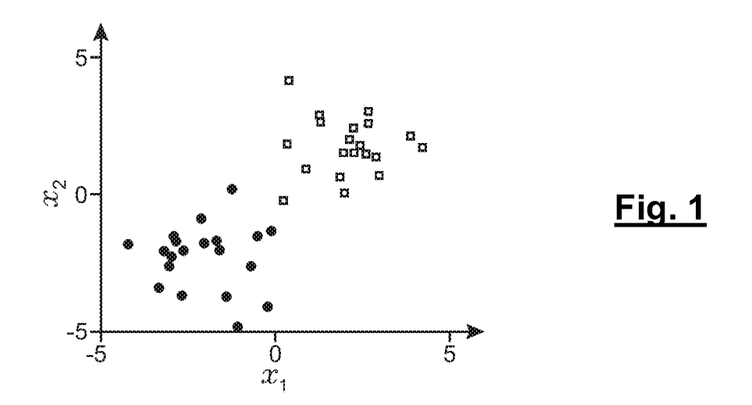
FIG. 1 schematically illustrates an example of a dataset defined by two features following a binary response model.

Consider an example of dataset as illustrated in FIG. 1. Each element of the dataset can be described by two attributes (or features) $x_1$, $x_2$ and has a binary response $t=\{0,1\}$. In other words, each element can be classified as belonging to a first class, $t=0$, (points plotted as a circle) or as belonging to a second class, $t=0$ (points plotted as a square).

The data elements of the dataset can be represented by vectors $x_n$, the size of which being the number M of attributes (here M=2). These vectors can be stacked in a matrix $X=(x_1^T, x_2^T, \ldots, x_N^T)^T$ where N is the number of elements in the dataset, thereby representing the whole dataset. Similarly, the responses of the elements of the dataset can be stacked in a vector $t=(t_1, t_2, \ldots, t_N)^T$.

We look for a linear model which would allow us to classify the data elements of the dataset according to their known responses and predict the class of a new observation $x_{new}$. More specifically, we assume that for any data element $x_n$ of the dataset the probability that it belongs to the first class ($T_n=0$) decreases with the dot product $w^T x_n$ where w is a vector, hereinafter referred to as parameter vector capturing the parameters of the model. Conversely, we assume that the probability that data element $x_n$ belongs to the second class ($T_n=1$) increases with the dot product. A simple way to convert the dot product into a probability value is to squash the dot product into the range [0,1] with a sigmoid function (a.k.a. standard logistic function), according to the log it model:

$$P(T_n = 1 \mid x_n) = \frac{1}{1 + \exp(-w^T x_n)} \quad (1\text{-}1)$$

and therefore:

$$P(T_n = 0 \mid x_n) = 1 - P(T_n = 1 \mid x_n) = \frac{\exp(-w^T x_n)}{1 + \exp(-w^T x_n)} \quad (1\text{-}2)$$

Following a Bayesian approach, we now consider the parameter vector as a random vector and are interested in finding the posterior probability density (also called posterior density or, simply, posterior) knowing the dataset elements and their respective classes, that is p(w|t, X). The posterior can be obtained from the prior probability density, p(w), (also called prior density or, simply, prior), the likelihood p(t|X, w) and the marginal likelihood, p(t|X), according to Bayes' rule:

$$p(w \mid t, X) = \frac{p(t \mid X, w) p(w)}{p(t \mid x)} \quad (2)$$

where the marginal likelihood is obtained by $p(t|X)=\int p(t|X, w)p(w)dw$.

In the following, the posterior p(w|t, X) will simply be denoted $\pi(w)$ and the likelihood of parameter vector w, p(t|X, w), will be denoted $\ell(w)$. Since p(t|X) is a constant depending only upon the dataset, the posterior is proportional to the product of the likelihood with the prior:

$$\pi(w) = Z \ell(w) \cdot p(w) \quad (3)$$

where Z is a constant.

It should be noted that the terms posterior and prior always refer to the available observations (the dataset X) and their respective responses (t).

Assuming that the elements of t are conditionally independent, the likelihood $\ell(w)$ can be expressed as follows:

$$\ell(w) = p(t \mid X, w) = \quad (4)$$
$$\prod_{n=1}^{N} p(t_n \mid x_n, w) = \prod_{n=1}^{N} (p(T_n = 1 \mid x_n, w))^{t_n} (p(T_n = 0 \mid x_n, w))^{1-t_n}$$

and therefore, substituting expressions (1-1) and (1-2) into (4):

$$\ell(w) = \prod_{n=1}^{N} \left( \frac{1}{1 + \exp(-w^T x_n)} \right)^{t_n} \left( \frac{\exp(-w^T x_n)}{1 + \exp(-w^T x_n)} \right)^{1-t_n} \quad (5)$$

Even assuming a known distribution e.g. a Gaussian distribution for the prior $\pi(w)$, it is generally impossible to compute the denominator $Z^{-1}$ of (2) because the integration of the likelihood p(t|X, w) for obtaining the marginal likelihood p(t|X) is not analytically tractable.

Several options are available at this stage. According to a first option, one may look for the parameter vector, $\hat{w}_{MAP}$ (where MAP stands for Maximum A Posteriori) achieving the maximum value of the posterior, $\pi(w)$ and predict the class of a new observation according to (1-1) and (1-2) with the MAP parameter vector, $\hat{w}_{MAP}$. According to a second option, referred to as Laplace approximation, one may try to approximate the posterior around its maximum value by a gaussian distribution. A third option, which better captures the distribution of the parameter vector is to sample the posterior $\pi(w)$ knowing the likelihood $\ell(w)$ and the prior p(w) and availing of the proportionality relationship (3). Sampling means drawing samples of the parameter vector w according to the posterior $\pi(w)$. Once Ns samples of the posterior have been obtained, $w_s$, $s=1, \ldots$, Ns, namely once we have got Ns models we can predict the class of a new observation $x_{new}$ (unseen data point) by calculating the average:

$$P(T_n = 1 | x_{new}) = \frac{1}{NS} \sum_{s=1}^{Ns} \frac{1}{1 + \exp(-w_s^T x_{new})} \quad (6\text{-}1)$$

and therefore:

$$P(T_n = 0 | x_{new}) = 1 - P(T_n = 1 | x_{new}) = \frac{1}{Ns} \sum_{s=1}^{Ns} \frac{\exp(-w_s^T x_{new})}{1 + \exp(-w_s^T x_{new})} \quad (6-2)$$

Figure 2:
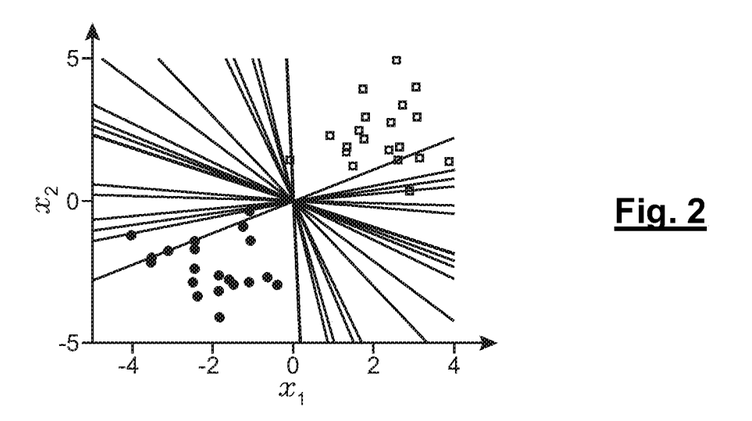
FIG. 2 schematically illustrates decision boundaries corresponding to instances of the model parameters for separating the two classes of response in FIG. 1.

Each instance of $w_s$ capturing the model parameters is associated with a linear decision boundary in the space of attributes as shown in FIG. 2. More generally, each sample $w_s$ defines a decision boundary is the form of a hyperplane in the space of attributes.

It follows from expression (6-1) and (6-2) that we can train a logistic regression classifier on the data set X with known labels t provided we are able to sample the posterior $\pi(w)$.

The sampling of $\pi(w)$ can be achieved by a so-called MCMC (Markov Chain Monte Carlo) technique allowing to explore the parameter space according to a Markov stochastic process. A popular sampling algorithm using this technique is the Metropolis-Hastings algorithm which is outlined further below. A detailed presentation of the Metropolis-Hastings algorithm and its application to machine learning can be found for instance in the book by Simon Rogers and Mark Girolami entitled "First course in Machine Learning", Chapter IV, second edition, Chapman & Hall/CRC Press, 2017, or in the article of C. Andrieu et al. entitled "An introduction to MCMC for machine learning" published in Machine Learning, vol. 5, pages 5-43, 2003.

Figure 3:
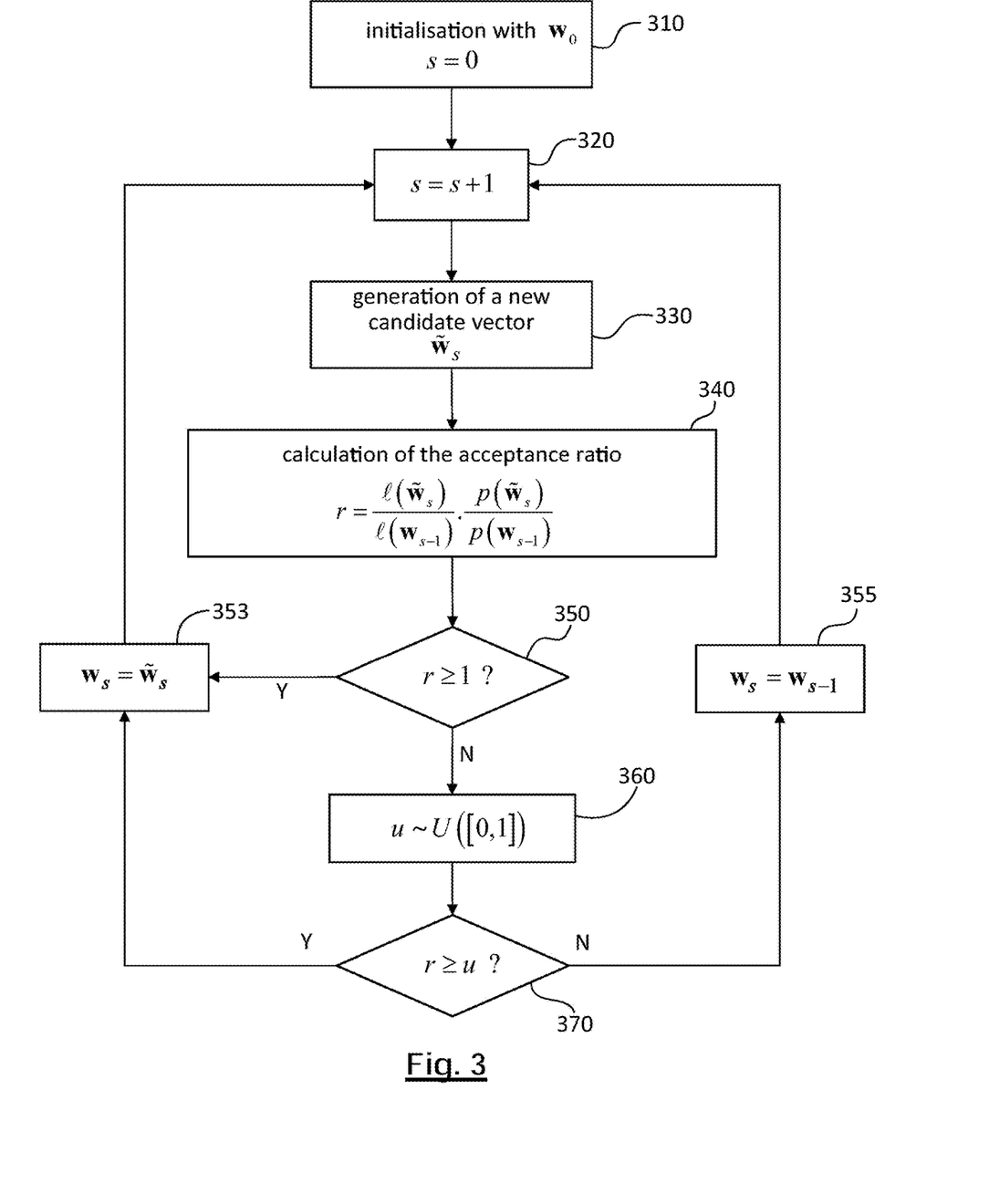
FIG. 3 schematically illustrates the flow chart of the Metropolis-Hastings algorithm for sampling the model parameters.

A flowchart of the Metropolis-Hastings algorithm is illustrated in FIG. 3.

It assumes that a conditional probability density for moving from a parameter vector to a next one is defined beforehand.

The algorithm starts at step 310 with an arbitrary parameter vector $w_0$, and by initialising an iteration counter s=0.

At step 320, the iteration counter is incremented by one, that is s=s+1.

At step 330, a new candidate parameter vector, $\tilde{w}_s$, is generated by using the conditional probability density $p(\tilde{w}_s | w_{s-1})$ mentioned above. Without prejudice to generality, this conditional probability density can be chosen Gaussian, i.e. $p(\tilde{w}_s | w_{s-1}) \square N(w_{s-1}, \Sigma)$ where $\Sigma$ is a predetermined covariance matrix. $\Sigma$ is chosen diagonal and its eigenvalues are chosen commensurate with the parameter space to explore. It should be noted that the conditional probability density is simply here to define a random walk through the parameter space and is not related to the posterior $\pi(w)$.

Figure 4:
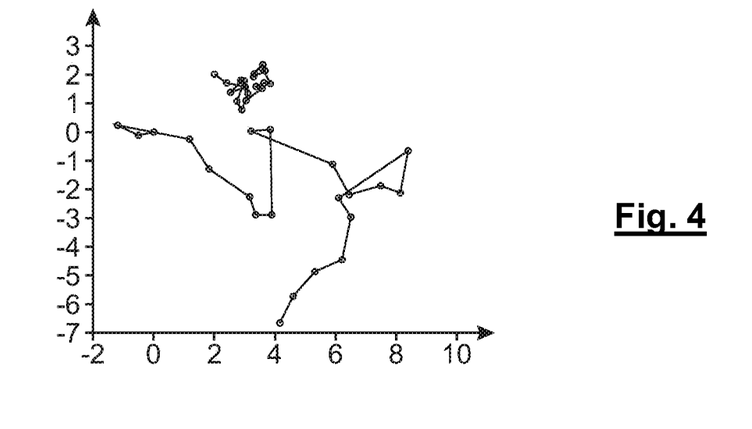
FIG. 4 shows an example of random walk in the model space performed by the Metropolis-Hastings algorithm.

FIG. 4 illustrates an example of random walk in the model space performed by the Metropolis-Hastings algorithm. The average size of a move from one sample to the next is given by the eigenvalues of the covariance matrix.

Returning to the flowchart of FIG. 3, step 340 calculates an acceptance ratio, r, defined as the ratio of the posterior density at the candidate sample $\tilde{w}_s$ to that at the previous sample $w_{s-1}$, divided by the ratio of the proposed densities, namely:

$$r = \frac{\pi(\tilde{w}_s)}{\pi(w_{s-1})} \cdot \frac{p(w_{s-1} | \tilde{w}_s)}{p(\tilde{w}_s | w_{s-1})} = \frac{\pi(\tilde{w}_s)}{\pi(w_{s-1})} \quad (7)$$

since the Gaussian distribution is symmetrical. The acceptance ratio r appraises the suitability of the candidate vector $\tilde{w}_s$ to better classify the data of the dataset than vector $w_{s-1}$ output by the previous iteration.

Although the posteriors cannot be calculated due to the presence of the constant Z, their ratio can be easily obtained from expression (3) as the product of the ratio of the priors with the ratio of likelihoods:

$$r = \frac{\pi(\tilde{w}_s)}{\pi(\tilde{w}_{s-1})} = \frac{\ell(\tilde{w}_s)}{\ell(w_{s-1})} \cdot \frac{p(\tilde{w}_s)}{p(w_{s-1})} \quad (8)$$

in which we will assume that the priors are all Gaussian i.e. $p(\tilde{w}_s) \square N(0, \sigma I_M)$ and $p(w_{s-1}) \square N(0, \sigma I_M)$, where $I_M$ is the identity matrix of size M×M, M being the size of the data elements, that is the number of attributes.

It is checked at step 350 whether the acceptance ratio is greater than or equal to 1. In the affirmative, the algorithm jumps to step 353 where the candidate vector is accepted that is $w_s = \tilde{w}_s$. In the negative, the algorithm proceeds further with step 360 where a sample value, u, of a random variable U having a uniform probability density on the interval [0,1] is drawn.

It is then checked at step 370 whether the sample value, u, is lower than or equal than the acceptance ratio, r. In the affirmative, the algorithm jumps to step 353 where the candidate vector is accepted, that is $w_s = \tilde{w}_s$. However, in the negative, the candidate vector is rejected at step 357 and the parameter vector output by the iteration s is chosen equal to the one output by previous iteration, that is $w_s = w_{s-1}$.

In other words, if posterior density at $\tilde{w}_s$ is higher that the posterior density at $w_{s-1}$, the candidate vector is systematically retained whereas it is only conditionally retained otherwise. Hence, it should be understood that due to the rejection mechanism, several consecutive samples of the sequence $w_s$, s=1, . . . , Ns may be identical.

After having being updated by the candidate vector (step 353) or not (step 357), the algorithm goes back to step 320 for a new iteration.

Since, u≤1, it is important to note that step 350 can be skipped. It suffices then to compare the acceptance ratio, r, with u in 370, the parameter vector being updated with $\tilde{w}_s$ if u≤r and being kept equal identical to the previous parameter vector $w_{s-1}$ otherwise.

The algorithm stops when a predetermined stopping criterion (not represented) is met, e.g. when a predetermined number $N_s$ of samples have been obtained.

The Metropolis-Hastings algorithm can be run on a traditional computer for training a logistic regression classifier. However, when the dataset is large or when the size ($N_s$) of the model is large, the algorithm requires a large size memory and powerful computer resources.

An object of the present invention is to propose a method for training a logistic regression classifier which can be carried out very efficiently on a hardware accelerator having very simple architecture.

BRIEF DESCRIPTION OF THE INVENTION

The present invention is defined by the appended independent claims. Various preferred embodiments are defined in the dependent claims.

BRIEF DESCRIPTION OF THE DRAWINGS

The present invention will be better understood from the description of the following embodiments, by way of illustration and in no way limitative thereto.

DETAILED DISCLOSURE OF PARTICULAR EMBODIMENTS

The idea at the basis of the present invention is to use a resistive switching RAM also simply called resistive memory (RRAM) for implementing the training of a logistic regression classifier according to the Metropolis-Hastings algorithm. More specifically, the invention makes use of the cycle to cycle (C2C) variability programmed resistances in a RRAM, namely of the low-resistance after a SET operation or of the high-resistance after a RESET operation, in order to generate successive parameter vectors of the model.

We recall that a resistive switching RAM consists of non-volatile random access memory cells, each cell comprising a resistor made of dielectric which can be programmed either in a low resistance state (LRS) with a so-called SET operation or in a high resistance state (HRS) with a so-called RESET operation. During a SET operation, a strong electric field is applied to the cell, while limiting the current to a programming current value. This operation forms a conductive filament through the dielectric and brings the resistor to a low resistance value, $R_{LO}$ which depends upon the programming current value.

Conversely, during a RESET operation, a programming voltage is applied to the cell with the same or opposite polarity than the one used for electroforming. This voltage breaks the filament and the resistor returns therefore to a high resistance value, $R_{HI}$ which depends upon the programming voltage value.

A detailed description of RRAM can be found in the article by R. Carboni and D. Ielmini, entitled "Stochastic memory devices for security and computing", published in Adv. Electron. Mat., 2019, 5, 1900198, pages 1-27.

Once a cell has been programmed by a SET or a RESET operation, the resistance value ($R_{LO}$ or $R_{HI}$) is stable in time until the next operation is performed. However, the low resistance value varies from one SET operation to the next, even if the programming current is kept constant. More specifically, for a given programming current, the low resistance $R_{LO}$ can be considered as a random variable which exhibits a normal distribution over SET operations (cycle to cycle variability). Expressed otherwise, each time a SET operation is applied to the memory cell, the obtained resistance value is sampled from this normal distribution.

Similarly, the high resistance value varies from one RESET operation to the next, even if the programming voltage is kept constant. More specifically, for a given programming voltage, high resistance $R_{HI}$ can be considered as a random variable which follows a log-normal distribution over the RESET operations (cycle to cycle variability). In other words, each time a RESET operation is applied to the memory cell, the obtained resistance value is sampled from this log-normal distribution.

Figure 5:
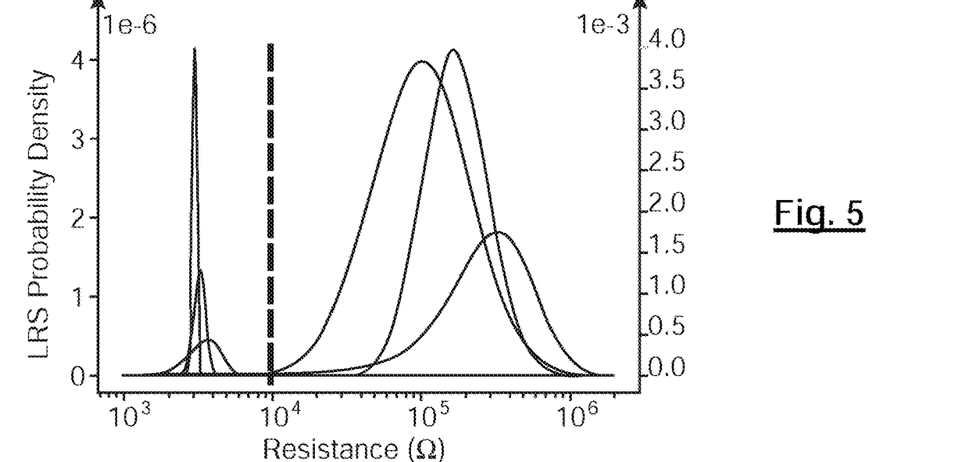
FIG. 5 shows examples of a probability density function of the resistance value of a cell in a low resistance state as well as examples of a probability density function of the resistance value of a cell in a high resistance state.

FIG. 5 shows, on its left side, examples of probability density function of $R_{LO}$ for a cell in a low resistance state. The three examples shown correspond to three different RRAM cells. It also shows, on its right side, examples of probability density function of $R_{HI}$ for a cell in a high resistance state HRS. The three examples shown correspond to the same three RRAM cells. The probability density function has been obtained by cycling 100 times each of the cells. The x-axis being represented in logarithm scale and the shape of $R_{HI}$ distribution being Gaussian, this confirms that $R_{HI}$ follows a log-normal distribution.

Figure 6:
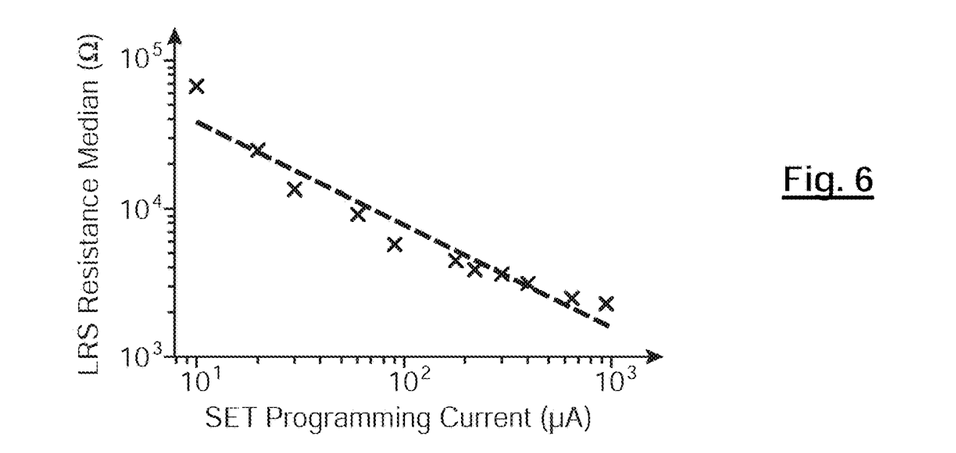
FIG. 6 shows the relationship between the SET programming current and the median low resistance value of a cell in an LRS state.

The median value of the $R_{LO}$ distribution (or, equivalently, the mean value since the distribution is normal) depends on the programming current value during the SET operation as illustrated in FIG. 6. The x-axis indicates the programming current (in µA) according to a logarithmic scale whereas the y-axis indicates the median value $R_{LO}^{median}$ (in Ω) according to a logarithmic scale. This dependency being linear in log scale, it follows that the median value of the low resistance follows a power law of the type $R_{LO}^{median} = \alpha (I_{SET})^{-\gamma}$ where α and γ are positive coefficients.

Figure 7:
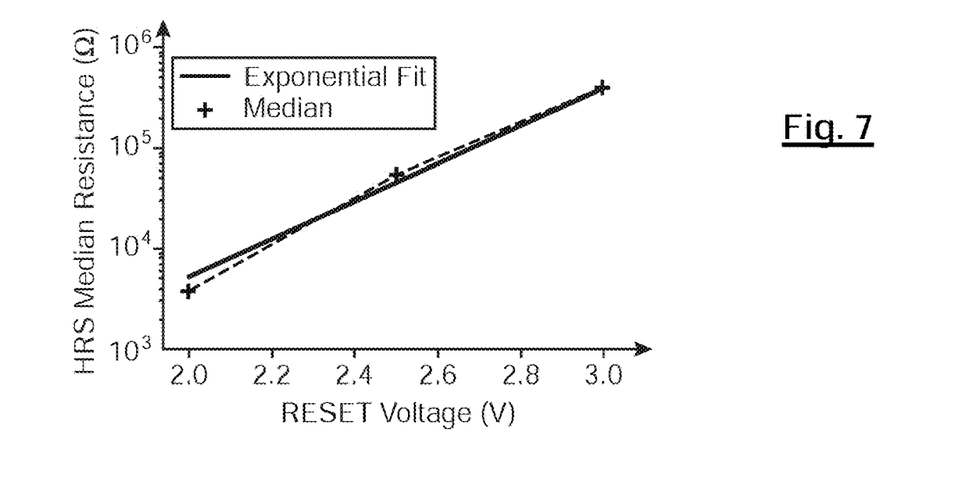
FIG. 7 shows the relationship between the RESET programming voltage and the median high resistance value of a cell in an HRS state.

Furthermore, the median value of the $R_{HI}$ distribution depends upon the programming voltage value during the RESET operation, as illustrated in FIG. 7. The x-axis indicates the programming voltage (in V) according to a linear scale whereas the y-axis indicates the median value, $R_{HI}^{median}$ (in Ω) according to a logarithmic scale. This dependency being linear in semi-log scale, it follows that the median value of the high resistance follows an exponential law of the type $R_{HI}^{median} = b \exp(\lambda V_{RESET})$ where b and λ are positive coefficients.

Figure 8:
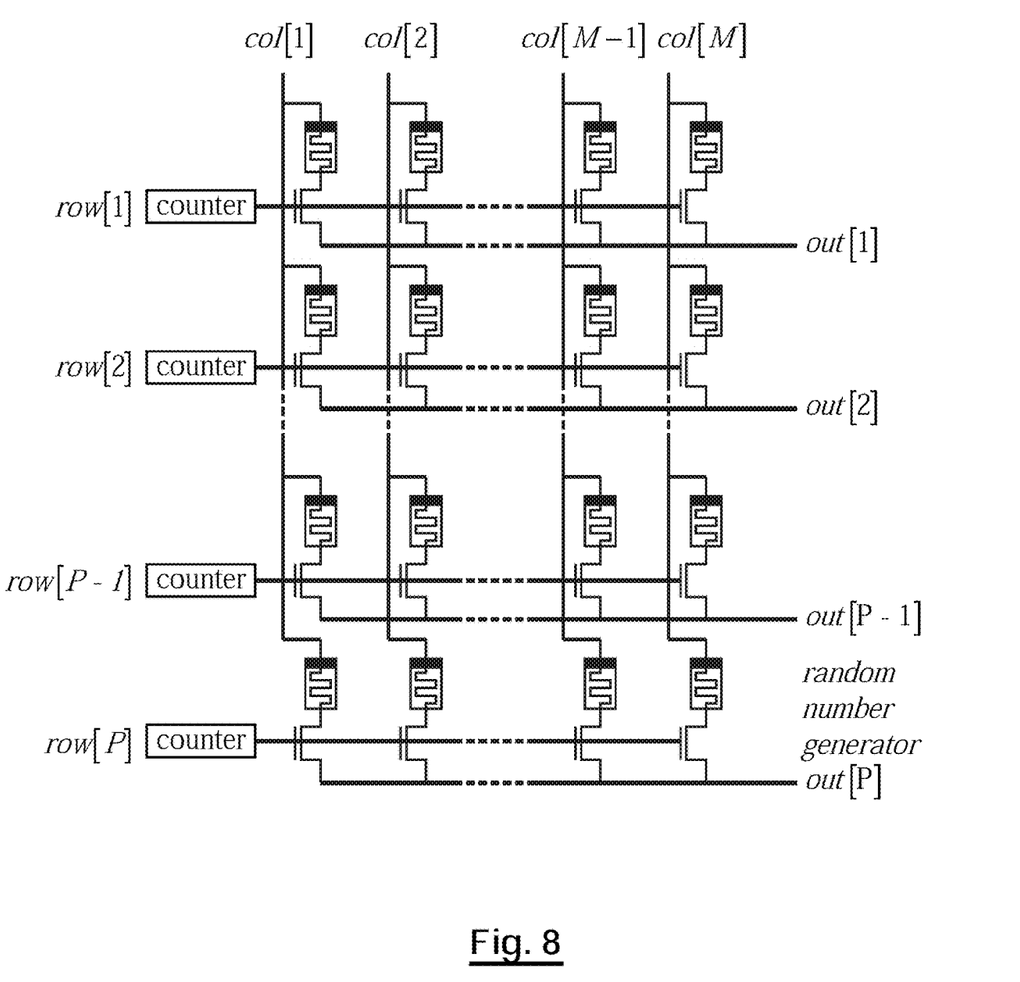
FIG. 8 shows the structure of a RRAM which can be used for a training method according to a first embodiment of the invention.

According to a first embodiment of the invention, the method for training a logistic regression classifier uses a resistive RAM structure as shown in FIG. 8.

The resistive RAM is comprised of word lines which are addressed by word select signals row[0], row[1], . . . , row[P]. Each word line is comprised of M cells where M stands for the number of attributes, each word line being intended to store a sample a parameter word of the model. Furthermore, each word line is associated with a counter of occurrences, the function of which will be described further below.

The cells of a column, m=1, . . . , M, can be fed with a data control signal col[m]. Each cell comprises a FET transistor, the gate of which is controlled by a word select signal and the source of which is connected to a data control signal through a resistor, $R_{p,m}$. The drains of the FETs of a word line, p=1, . . . , P, are all connected to the same output line, out[p].

During a write operation into a cell located at the intersection of row p and column m, word select signal row[p] is applied and a programming voltage is applied to col[m]. The programming can occur during a SET operation or a RESET operation as mentioned above.

During a read operation of a cell located at the intersection of row p and column m, a word select signal is applied at row[p] and a data control signal is applied at col[m]. Assuming that a voltage $x_m$, is applied to col[m], the output line output[p] will output a current $x_m/R_{p,m}=g_{p,m}x_m$, where $g_{p,m}$, is the conductance of the resistive RAM cell. If the RAM cell was programmed to store a value (of conductance) $w_{p,m}$, the output current would be $w_{p,m} \cdot x_m$. Hence, if all the cells of a line are read simultaneously, the output current of line output[p] will be the value of the dot product $w_p^T x$, where $x=(x_1, \ldots, x_M)^T$ and $w_p$ is the parameter vector stored at line p.

Figure 9:
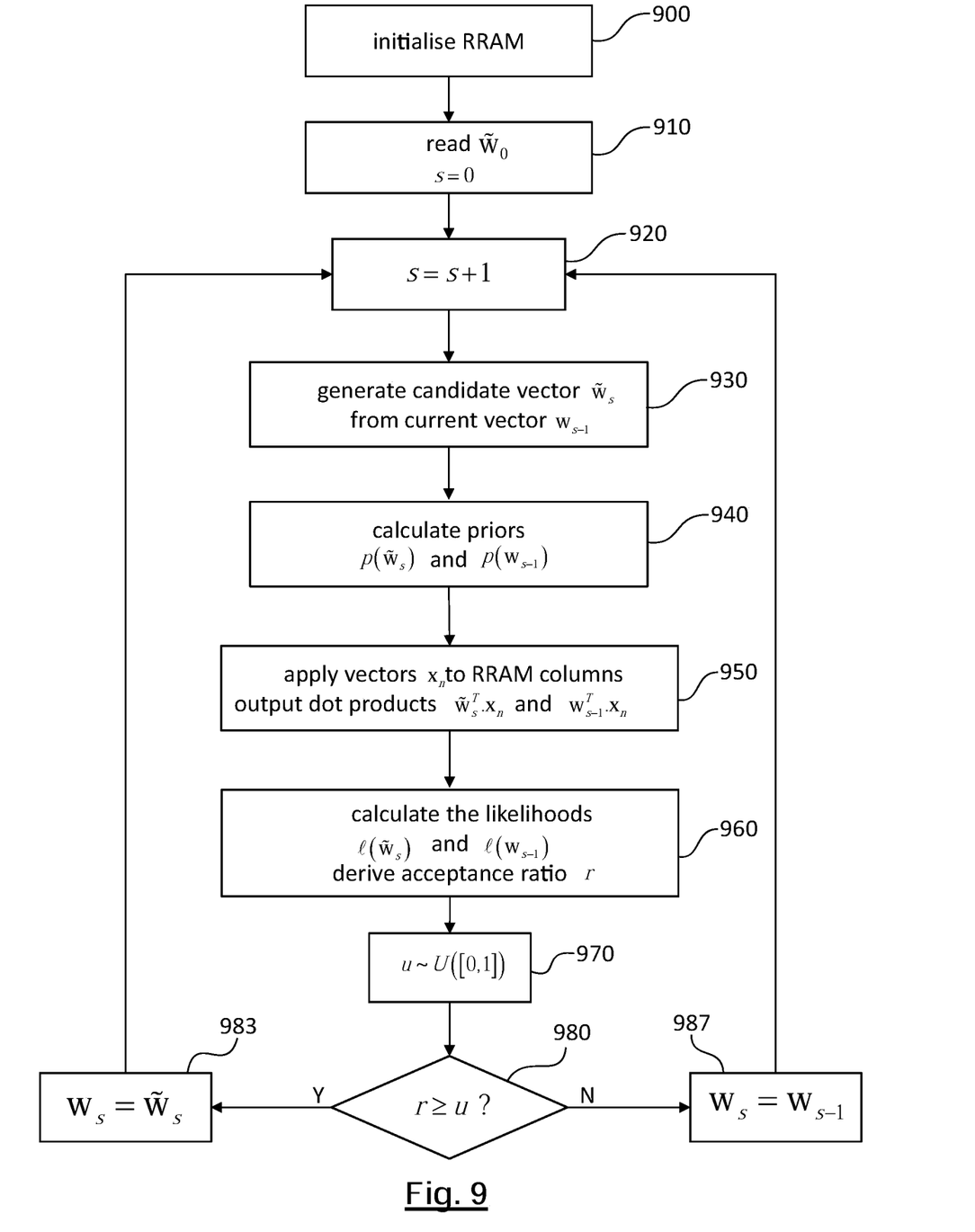
FIG. 9 schematically illustrates the flowchart of a method for training a logistic regression classifier on a dataset by using the RRAM of FIG. 8, according to the first embodiment of the invention.

The resistive RAM of FIG. 8 can be used as hardware accelerator for training a logistic regression classifier on a dataset as explained in the flowchart of FIG. 9.

We adopt here the same notations as in the introductory part of the application. Each element of the training dataset is represented by M attributes which can be stacked in a vector x of size M. Each element of the training dataset is labelled with a binary target t indicating whether the element in question belongs to a first class or to a second class.

The probability of an element x belonging to a class is modelled by a logistic function applied to a score $w^T x$ where w is a parameter vector of size M. More specifically, the probability of element x belonging to the first class is given by:

$$P(T_n = 1 \mid x) = \frac{1}{N_s}\sum_{s=1}^{N_s} \frac{1}{1+\exp(-w_s^T x)} \quad (9-1)$$

whereas the probability of this element belonging to the second class is given by:

$$P(T_n = 0 \mid x) = \frac{1}{N_s}\sum_{s=1}^{N_s} \frac{\exp(-w_s^T x)}{1+\exp(-w_s^T x)} \quad (9-2)$$

where the parameter vectors $w_s$, s=1, . . . , Ns are obtained by MCMC sampling the posterior $\pi(w)$, that is knowing the elements of the dataset X and their respective labels.

At step 900, the RRAM is initialised by programming all the cells in either the first resistance state (LRS), according to a first variant or the second resistance state (HRS), according to a second variant that is by performing a SET operation (first variant) or a RESET operation (second variant) on all the cells of the RRAM. Preferably, the cells are programmed in the first resistance state for reasons that will become more apparent below.

At step 910, the first row of the RAM is read, that is the data $\tilde{w}_{0,1}, \ldots, \tilde{w}_{0,M}$ forming a first initial parameter vector $\tilde{w}_0$. The counter of iterations s is initialized, s=0. The counters of occurrences associated with the different rows are reset to zero.

The training method then enters an iterative loop, where s stands for the current iteration, $w_{s-1}$ is the current parameter vector which has already been stored in the RRAM at the previous iteration and $\tilde{w}_s$ is a candidate parameter vector at iteration s At step 920, the counter of iterations is incremented, s=s+1.

At step 930, a candidate parameter vector, $\tilde{w}_s$, is generated from the current parameter vector, $w_{s-1}$, by reading the cells of the current row and programming the cells of the next row with a SET operation ($1^{st}$ variant) or with a RESET operation ($2^{nd}$ variant). More specifically a current or voltage is read from the cell of current row j and applied as a voltage to the cell of the next row of the same column. By so doing, a candidate vector, $\tilde{w}_s$, is generated with conditional probability $p(\tilde{w}_s|w_{s-1})$ according to a normal distribution law ($1^{st}$ variant), and stored temporarily at row j+1. As to the second variant, the current or voltage read from the cell current row j is generated with a conditional probability which follows a log-normal law. Preferably, the read current or voltage is applied to an exponential amplifying circuit (for example an operational amplifier having an exponential characteristic element, such as a diode or biased FET on its non-inverting input) before being applied to the cell of the next row and same column. The exponential amplifying circuit projects the log-normal distribution into a normal distribution.

It follows from this step that the resistances of the cells of the next row are derived from the resistances of the current row according to a Markovian process.

At step 940, the current parameter vector, $w_{s-1}$, and the candidate parameter, $\tilde{w}_s$, respectively stored at the current row and at the next row are read from the RRAM. The priors $p(\tilde{w}_s)$ and $p(w_{s-1})$ are calculated by a processor (not shown) from a predetermined gaussian law which may have been obtained during a calibration phase. Preferably, these values are calculated under a logarithm form, i.e. $\log(p(\tilde{w}_s))$ and $\log(p(\tilde{w}_{s-1}))$.

At step 950, the vectors $x_n$, n=1, . . . , N of the dataset X are applied in turn to the set of columns of the RRAM. The output lines output[j] and output[j+1] respectively output the dot products $\tilde{w}_s^T \cdot x_n$ and $w_{s-1}^T \cdot x_n$ n=1, . . . , N, which are supplied to the processor.

At step 960, the processor computes the likelihoods $\ell(\tilde{w}_s)$ and $\ell(w_{s-1})$ from expression (5):

$$\ell(\tilde{w}_s) = \prod_{n=1}^{N}\left(\frac{1}{1+\exp(-\tilde{w}_s x_n)}\right)^{t_n}\left(\frac{\exp(-\tilde{w}_s^T x_n)}{1+\exp(-\tilde{w}_s^T x_n)}\right)^{1-t_n} \quad (10-1)$$

$$\ell(w_{s-1}) = \prod_{n=1}^{N}\left(\frac{1}{1+\exp(-w_{s-1} x_n)}\right)^{t_n}\left(\frac{\exp(-w_{s-1}^T x_n)}{1+\exp(-w_{s-1}^T x_n)}\right)^{1-t_n} \quad (10-2)$$

It is noted that for each term of product (10-1) or (10-2) only one of the two ratios has to be computed (namely the one corresponding to $t_n=1$).

Preferably, the log-likelihoods $\log(\ell(\tilde{w}_s))$ and $\log(\ell(w_{s-1}))$ are calculated instead as a sum of terms, only those being weighted by $t_n=1$ needing to be computed.

The processor then computes the product of the ratio of the likelihoods $$\frac{\ell(\tilde{w}_s)}{\ell(w_{s-1})}$$

with the ratio of the priors $$\frac{p(\tilde{w}_s)}{p(w_{s-1})}$$

to obtain the acceptance ratio according to expression (8).

Preferably, the acceptance ratio can be computed under its logarithm form, log(r) as the sum of difference of log-likelihoods and difference of log of priors.

At step 970, a random value u is sampled from a random variable U exhibiting a uniform probability density law over range [0,1]. The random value can be generated by the processor. Alternatively, it can be generated by a dedicated row of the RRAM, for example row[P] as shown in FIG. 8. In order to obtain a uniform distribution, a voltage close to the threshold SET voltage is applied as data control signal to the columns col[m] m=1, . . . , M. In such instance, each cell has a probability ½ to be in the LRS state and a probability ½ to be in the HRS state. Upon reading the word stored at row[P], the output line output[P] supplies current is supplied which is uniformly generated between 0 and a predetermined value $I_{max}$, from which the random value u of uniform law over range [0,1] can be derived.

At step 980, the acceptance ratio r is compared with the random value u. In practice, the comparison can be performed between the logarithmic values log(r) and log(u).

If r≥u, the candidate parameter vector $w\tilde{w}_s$ is retained as the new current vector at step 983, that is $w_s = w\tilde{w}_s$ and the new current row is j+1. The counter of occurrences associated with row j+1 is set to 1.

Else, if r<u, the candidate parameter is rejected at step 987, that is $w_s = w_{s-1}$, the current row is kept at j and the counter of occurrences associated with row j is incremented by one.

In both cases, the algorithm checks whether a stopping criterion is met, for example whether $s = N_s$, that is whether a maximum number of samples has been reached or if the RRAM is full. In the negative, the algorithm goes back to step 920. Otherwise, it stops. According to a variant, instead of stopping when the RRAM is full, that is when the last row has been reached, the algorithm loops back to the first row and goes on as before. This variant is of interest when convergence to the posterior is slow.

Figure 10:
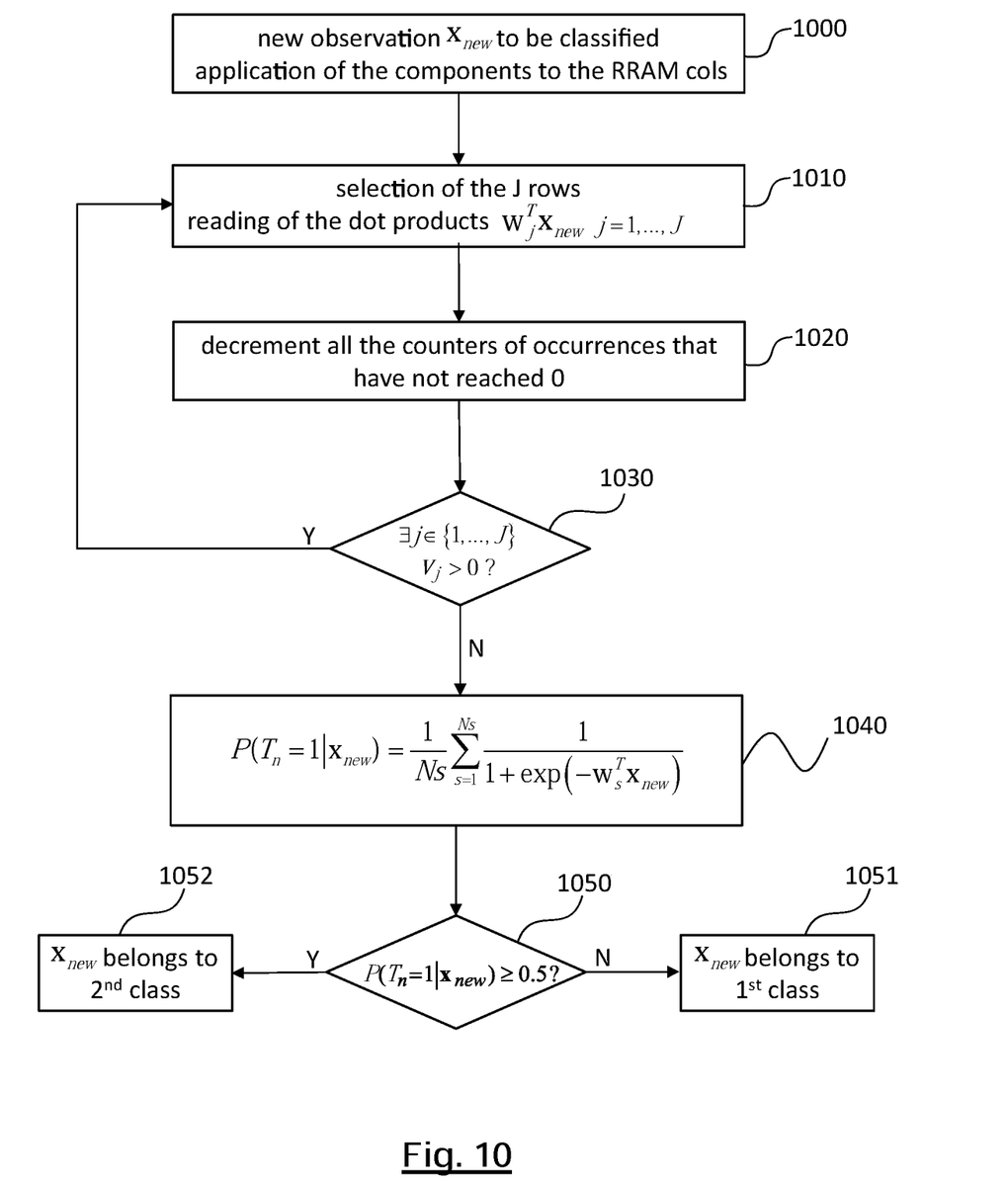
FIG. 10 shows a method for classifying new data with a RRAM based logistic regression classifier after it has been trained by a training method according to the first embodiment of the invention.

Once the logistic regression classifier has been trained on the training dataset, that is, in practice, when the $N_s$ samples of parameter vector have been stored in the RRAM, the RRAM can be used for the classification of new observation as shown in FIG. 10.

FIG. 10 shows a method for classifying new observation with a RRAM based logistic regression classifier after it has been trained by a training method according to the first embodiment of the invention.

The RRAM contains Ns samples of the model parameter vector $w_s$, s=1, . . . , Ns. It is nevertheless important to understand that the same sample value may occur several times, the occurrences of the same sample value being stored in the same row. More specifically, if we denote $v_j$ the integer stored in the counter of occurrences associated with row j and J the number of rows where a sample has been stored (i.e. the rows for which the associated counters are not equal to zero), we have the relationship:

$$N_s = \sum_{j=1}^{J} v_j \qquad (11)$$

At step 1000, when a new observation $x_{new}$ is to be classified, its components are applied as data control signals to columns 1, . . . , M. These control signals are in practice voltages proportional to the components of $x_{new}$.

The classifying then enters an iterative loop, the loop being iterated as long as an occurrence counter is not zero.

At step 1010, the first J rows are selected and output lines output[1], output[2], . . . , output[J] are read in parallel or in series by the processor. These output lines provide the dot products $w_j^T x_{new}$, j=1, . . . , J where $w_u$ is stored at row j. According to a variant, the first B rows of the RRAM can be ignored or discarded, these first B rows corresponding to a burn-in period of the training phase, corresponding to convergence to the posterior. In such instance, the J rows would be following these B rows.

After the output lines have been read, all the counters of occurrences that are not equal to zero are decremented by one at step 1020.

It is the checked at 1030 whether $\exists j \in \{1, \ldots, J\}$ such as $v_j > 0$. In the affirmative the algorithm goes back to step 1010. Conversely, in the negative, the iterative loop is exited. The reading of the output lines provides the sequence of samples (of the parameter vector) $w_s$, s=1, . . . , Ns.

Alternatively, instead of sequentially performing reading iterations until all the counters are equal to zero, the output of each line output[j] may be amplified by an amplifier whose gain is controlled by the value $v_j$ stored in the corresponding counter.

The processor calculates at step 1040 an average logistic regression value over the samples, according to expression (6-1) or (6-2).

Finally, at step 1050, it is decided upon comparing $P(T_n = 1 | x_{new})$ or $P(T_n = 0 | x_{new})$ with a predetermined threshold value (e.g. ½) whether data element $x_{new}$ belongs to the first class, 1051, or the second class, 1052.

Figure 11:
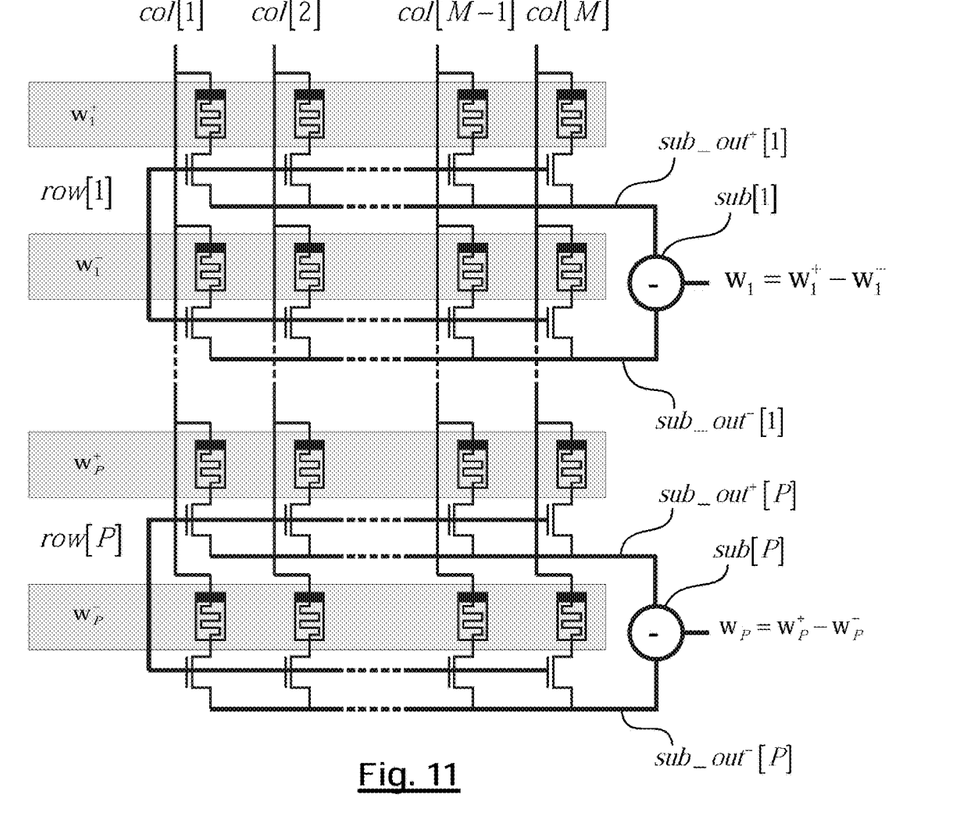
FIG. 11 shows the structure of a RRAM which can be used for a training method according to a second embodiment of the invention.

FIG. 11 shows the structure of a resistive RAM which can be used for a training method according to a second embodiment of the invention.

The structure of this resistive RAM differs from the one used in the first embodiment by the fact that the parameter vectors of the models are stored as differential pairs. More precisely, each parameter vector $w_j$ is represented by a pair $(w_j^+, w_j^-)$ with $w_j = w_j^+ - w_j^-$ where the first part, $w_j^+$, and the second part, $w_j^-$, of parameter vector $w_j$ are generated and stored separately in the RRAM.

More specifically, the resistive RAM is comprised of word lines which are addressed by word select signals row[0], row[1], . . . , row[P]. Each word select signal, row[j] controls in fact two sub-rows: a first sub-row storing the first part of the parameter vector, $w_j^+$, and a second sub-row containing the second part of the parameter vector, $w_j^-$. The outputs of the cells of the first sub-row of row j are connected to a first sub-row output line, sub_output$^+$[j] and the outputs of the cells of the second sub-row are connected to a second sub-row output line sub_output$^-$[j]. The first and second sub-row output lines are connected to the inputs of a subtractor sub[j].

The first sub-row of row j stores $w_j^+$ and the second sub-row of row j stores $w_j^-$. Hence, when the components of a vector x are applied to the data control lines and row j is selected, the first sub-row output line outputs $(w_j^+)^T x$ and the second sub-row output line outputs $(w_j^-)^T x$. The output of subtractor sub[j] is therefore $(w_j^+)^T x - (w_j^-)^T x = w_j^T x$.

The last row of the RRAM can be dedicated to an RNG as in the first embodiment. Alternatively, the RNG can be located off the RRAM.

The RRAM of FIG. 11 can be used for training a logistic regression classifier along the same lines as those described in relation with FIG. 9. Basically, for generating a parameter vector of a model, the first part, $w_j^+$, and the second part, $w_j^-$, of the parameter vector are generated and respectively stored in the first sub-row and second sub-row of row j. However, a single counter of occurrences is associated to each row (and not each sub-row). Hence, when a new candidate vector, $\tilde{w}_s$ is generated, it first part $\tilde{w}_s^+$ and its second part $\tilde{w}_s^-$ are respectively stored in the first sub-row and second sub-row of the next row, j+1. Otherwise, the counter of occurrences associated with the row j is incremented.

The first variant (programming with the SET operation) and the second variant (programming with the RESET operation) envisaged for the first embodiment equally apply to the second embodiment.

Figure 12:
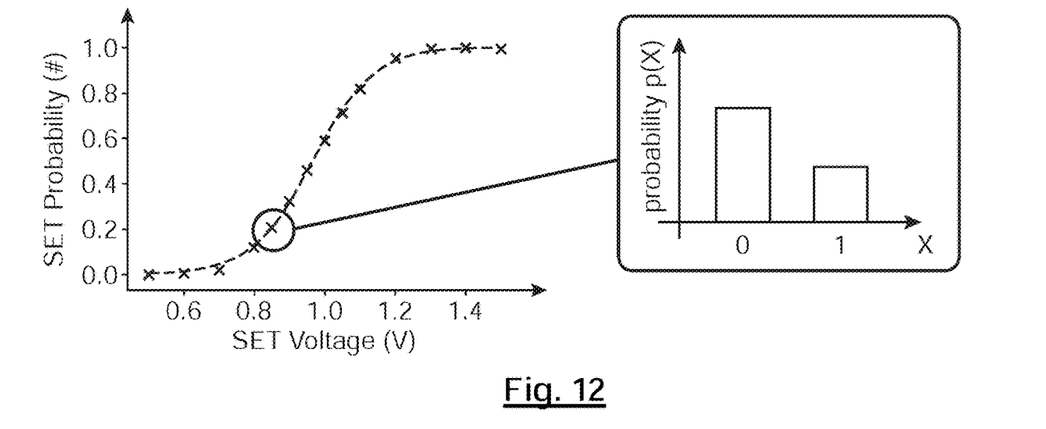
FIG. 12 schematically illustrates the programming of a RRAM according to a binary regime.

FIG. 12 schematically illustrates the programming of a RRAM in a binary regime.

A third embodiment of the present invention draws on a further way of programming a resistive memory, when it is in a so-called binary regime.

More specifically, when a RRAM cell is a high resistance state (HRS) and a programming voltage value $V_{set}$ belonging to a given range is applied to this cell during a SET operation, the RRAM cell switches to a low resistance state (HRS) with a flipping probability p which depends upon voltage value $V_{set}$.

The left part of FIG. 12 shows the probability of a RRAM cell to flip from HRS to LRS (SET probability) as a function of the SET voltage. The probability of flipping the state of a memory cell follows a Bernoulli distribution:

$$p(X=x)=p^x(1-p)^{1-x} \quad (12)$$

where x=0 represents the HRS state and x=1 represents the LRS state.

Similarly, when a RRAM cell is a low resistance state (LRS) and a programming voltage value $V_{reset}$ belonging to a given range is applied to this cell during a RESET operation, the RRAM cell switches to a high resistance state (HRS) with a flipping probability p' which depends upon voltage value $V_{reset}$.

According to a variant, the decision as to the whether the state of a RRAM cell is to be flipped can be generated by using a pseudo-random generator (e.g. a linear-feedback shift register or LFSR). The random number output by the pseudo-random generator is compared with a predetermined threshold value and the decision of flipping the state of a cell is made based upon the result of the comparison. For example, if the random number lies above the threshold value the state of the cell is flipped and, if not, the state of the cell is left unchanged.

Alternatively, it can be generated by using a dedicated row of the RRAM, as already explained in relation with FIG. 8 for generating a random value according to a uniform law. In such a case, a voltage close to the threshold SET voltage is applied as data control signal to the columns while selecting said dedicated row. The random value read from the dedicated row of the RAM is then compared with a predetermined threshold value and, again, the decision of flipping the state of a cell is made upon the result of the comparison.

The method for training a logistic regression classifier according to the third embodiment also uses a resistive RAM structure as depicted in FIG. 8. It follows the same flowchart as in FIG. 9 except for steps 930 and 940.

Indeed, the candidate parameter vector, $\tilde{w}_s$, is generated here from the current parameter vector, $w_{s-1}$, by considering each bit thereof and:
  if the bit read corresponds to a LRS state, flipping it with a probability p;
  if the bit read corresponds to a HRS state, flipping it with a probability p'.

The probability p' can be chosen such that p'=p.

Furthermore, the priors $p(w_{s-1})$ and $p(\tilde{w}_s)$ can be computed according to a Bernoulli law the parameters of which are obtained in a calibration phase.

Finally, the calculation of the likelihoods and of the acceptance ratio remains the same as in the first embodiment.

The man skilled in the art will understand that, instead of simulating a random walk according to a normal Markovian process, the training method according to the third embodiment simulates a discretized walk through the parameter space. In practice, when the number M of attributes is relatively high, the training method according to the third embodiment provides satisfactory results.

Once the RRAM has been trained according to the training method according to the third embodiment, it can be used as a logistic regression classifier as explained in relation of FIG. 10.

According to a variant, the logistic function in step 1040 can be omitted and the probability for a new observation, $x_{new}$, to belong to a class can be directly obtained from the scores, namely for the first class:

$$P(T_n = 1 \mid x_{new}) = \frac{1}{N_S} \sum_{s=1}^{N_S} w_s^T x_{new} \quad (13)$$

The present invention has been described in the context of the training of a logistic regression classifier, which classifies data into a class C (first class) or its complementary $\overline{C}$ (second class), the class the data belongs to being identified by a binary target value. The man skilled in the art will nevertheless understand that the invention can be extended to the training of a classifier which classifies data into a plurality of independent classes $C_1, C_2, \ldots, C_Q$ or the respective complementary classes. The RRAM is then divided in Q areas, each area being dedicated to a class $C_q$ and being associated with a corresponding logistic regression classifier. Alternatively, Q RRAMs can be used, each RRAM being dedicated to a class $C_q$ and being associated with a corresponding logistic regression classifier.

Finally, the training method according to the invention extends to a multinomial logistic classifier by using a softmax model instead of the log it model described above.

The invention claimed is:

1. A method for training a classifier comprising a plurality of logistic regression classifiers on a dataset, each element of the dataset being represented by a vector x of M attributes, hereinafter referred to as components, and belonging to a class among a plurality of independent classes $C_1, C_2, \ldots, C_Q$ or to a corresponding class among or the respective complementary classes of the independent classes $C_1, C_2, \ldots, C_Q$, the probability of an element x belonging to a class $C_i$ among said plurality of independent classes $C_1, C_2, \ldots, C_Q$ or to its respective complementary class being modelled by a logistic function applied to a score $w_i^t$ x of said element, i being an integer comprised between 1 and Q, where $w_i$ is a parameter vector of size M representing the model of said probability, said method comprising the sampling of said parameter vector according to its posterior probability density with respect to the data set, said method comprising:

providing a resistive RAM comprising cells which can be programmed in a first resistance state or a second resistance state, said resistive RAM comprising Q areas, or     providing Q resistive RAMs, each resistive RAM comprising cells which can be programmed in a first resistance state or a second resistance state, and each resistive RAM comprising an area,     each area comprising a set of rows, each row among the set of rows of said each area comprising at least one cell, each area being dedicated to a class Ci among said plurality of independent classes $C_1, C_2, \ldots, C_Q$ and being associated to a corresponding logistic regression classifier, each row being intended to store a parameter vector related to said corresponding logistic regression classifier, a counter of occurrences being associated with each row;

for each area, implementing the following steps:

initializing said area by setting all cells of said area in said first resistance state;

reading an initial vector $\tilde{w}_0$ from the first row of said area and entering an iterative loop comprising:

(a) generating a candidate parameter vector, $\tilde{w}_s$, from the current parameter vector, $w_{s-1}$, by reading the cells of the current row of the area and programming the resistances of the cells of the next row of the area, the resistances of the cells of the next row of the area being derived from the resistances of the cells of the current row of the area according to a Markovian process;

(b) computing an acceptance ratio, r, of the candidate parameter vector, $\tilde{w}_s$, as the ratio of the posterior densities of $\tilde{w}_s$ and $w_{s-1}$, with respect to the dataset;

(c) drawing a value u from a uniform distribution between 0 and 1 and comparing it with the acceptance ratio, r;

(d1) if u≤r taking the next row of the area as the current row of the area and jumping to step (a);

(d2) else, keeping the current row of the area, incrementing the counter of occurrences associated therewith and jumping to step (a);

the training method being stopped when a predetermined stopping criterion is met.

2. The method for training a classifier comprising a plurality of logistic regression classifiers according to claim 1, wherein the first resistance state is a high resistance state and the second resistance state is a low resistance state, and that, for each area, at step (a), the current or voltage read from a cell of the current row of the area is used for applying a voltage to a corresponding cell of the next row of the area while programming said cell in the low resistance state.

3. The method for training a classifier comprising a plurality of logistic regression classifiers according to claim 1, wherein the first resistance state is a low resistance state and the second resistance state is a high resistance state, and that, for each area at step (a), the current or voltage read from a cell of the current row of the area is amplified by an exponentiation circuit before being applied as a voltage to a corresponding cell of the next row of the area while programming this cell in the high resistance state.

4. The method for training a classifier comprising a plurality of logistic regression classifiers according to claim 3, wherein, for each area, the value u from said uniform distribution is obtained by applying a predetermined voltage to all the cells of a dedicated row of the area, the outputs of the dedicated row of the area being connected to an output line of the area, said predetermined voltage being chosen close to the threshold voltage for programming the cells in a high resistance state, the value u being obtained from the output of said output line.

5. The method for training a classifier comprising a plurality of logistic regression classifiers according to claim 1, wherein at step (a) the resistances of the cells of the next row are programmed by switching the state of each of the resistances of the current row with a switching probability value.

6. The method for training a classifier comprising a plurality of logistic regression classifiers according to claim 1, wherein, for each area, the ratio of the posterior densities of $\tilde{w}_s$ and $w_{s-1}$ are obtained as the product of the ratio of the likelihoods $$\frac{\ell(\tilde{w}_s)}{\ell(w_{s-1})}$$

with respect to the dataset and the ratio of the priors $$\frac{p(\tilde{w}_s)}{p(w_{s-1})}.$$

7. The method for training a classifier comprising a plurality of logistic regression classifiers according to claim 6, wherein, for each area among said Q areas of said resistive RAM, the likelihood of the candidate parameter vector $\ell(\tilde{w}_s)$ is calculated as $$\ell(\tilde{w}_s) = \prod_{n=1}^{N} \left(\frac{1}{1+\exp(-\tilde{w}_s x_n)}\right)^{t_n} \left(\frac{\exp(-\tilde{w}_s^T x_n)}{1+\exp(-\tilde{w}_s^T x_n)}\right)^{1-t_n}$$

and the likelihood of the current parameter vector $$\ell(w_{s-1}) = \prod_{n=1}^{N} \left(\frac{1}{1+\exp(-w_{s-1} x_n)}\right)^{t_n} \left(\frac{\exp(-w_{s-1}^T x_n)}{1+\exp(-w_{s-1}^T x_n)}\right)^{1-t_n}$$

where $x_n$, n=1, ..., N are vectors representing data elements of the dataset, the dot product $\tilde{w}_s^T x_n$ being obtained by applying the components of vector $x_n$ to the cells of the row containing candidate parameter vector $\tilde{w}_s$, and by reading the common output line to which the cells of the row containing $\tilde{w}_s$ are connected, the dot product $\tilde{w}_{s-1}^T x_n$ being obtained by applying the components of vector $x_n$ to the cells of the row containing current parameter vector $w_{s-1}$, and by reading the common output line to which the cells of the row containing $w_{s-1}$ are connected.

8. The method for training a classifier comprising a plurality of logistic regression classifiers according to claim 1, wherein the predetermined stopping criterion is met when a predetermined number of samples (Ns) is reached or when the resistive RAM is full.

9. The method for classifying an observation with a classifier comprising a plurality of logistic regression classifiers trained according to claim 1, observation to be classified being represented by a vector $x_{new}$ of M components, further comprising:
for each area among said Q areas of said resistive RAM:
respectively applying the M components to the M cells of each row of said area storing a parameter vector;
(a') reading the output line associated with each row of said area for which the counter of occurrences is not null, the reading of the output line of said area providing the dot product $w_s^T x_{new}$ where $w_s$ is the parameter vector stored at this row of said area;
(b') decrementing the respective counters of occurrences of all the output lines that have been read at step (a');
steps (a') and (b') being repeated until all the counters of occurrences have reached zero, thereby obtaining a sequence of Ns parameter vectors, $w_s^T x_{new}$, s=1, ..., Ns;
computing the average $$P(T_n = 1 \mid x_{new}) = \frac{1}{Ns} \sum_{s=1}^{Ns} \frac{1}{1 + \exp(-w_s^T x_{new})}$$

and comparing it with a predetermined threshold value in order to determine whether said observation belongs to the first class or the second class.

10. A method for training a classifier comprising a plurality of logistic regression classifiers on a dataset, each element of the dataset being represented by a vector x of M attributes, hereinafter referred to as components, and belonging to a class among a plurality of independent classes $C_1, C_2, \ldots, C_Q$ or to a corresponding class among or the respective complementary classes of the independent classes $C_1, C_2, \ldots, C_Q$, the probability of an element x belonging to a class $C_i$ among said plurality of independent classes $C_1, C_2, \ldots, C_Q$ or to its respective complementary class being modelled by a logistic function applied to a score $w_i^t x$ of said element, i being an integer comprised between 1 and Q, where $w_i$ is a parameter vector of size M representing the model of said probability, said method comprising the sampling of said parameter vector according to its posterior probability density with respect to the data set, said method comprising:
providing a resistive RAM comprising Q areas or Q RAMs each comprising an area, each area being dedicated to a class $C_i$ among said plurality of independent classes $C_1, C_2, \ldots, C_Q$ and being associated to a corresponding logistic regression classifier, each area comprising a set of rows, each row of said each area comprising a first sub-row and a second sub-row, each sub-row comprising M cells which can be programmed in a first resistance state or a second resistance state, the first sub-row being configured to store a first part of a parameter vector related to said corresponding logistic regression classifier, the second sub-row being configured to store a second part of the same parameter vector, this parameter vector being obtained as the difference between said first part and said second part, and a counter of occurrences being associated with each row;
for each area, implementing the following steps:
initializing said area by setting all cells of said area in said first resistance state;
reading the first part and second part of an initial vector $\tilde{w}_0$ from the first row of said area and entering an iterative loop comprising:
(a) generating the first part and second part of a candidate parameter vector, $\tilde{w}_s$, respectively from the first part and second part of current parameter vector, $w_{s-1}$, by reading the cells of the first and second sub-row of current row of said area and programming the resistances of the first and second sub-row of next row of said area, the resistances of the cells of the first and second sub-row of next row of said area being derived from the resistances of the cells of the first and second sub-row of current row of said area according to a Markovian process;
(b) calculating the candidate parameter vector as the difference between its first part and second part; calculating the current parameter vector as the difference between its first part and second part; computing an acceptance ratio, r, of the candidate parameter vector, $\tilde{w}_s$, as the ratio of the posterior densities of $\tilde{w}_s$ and $w_{s-1}$, with respect to the dataset;
(c) drawing a value u from a uniform distribution between 0 and 1 and comparing it with the acceptance ratio, r;
(d1) if u≤r taking the next row of said area as the current row and jumping to step (a);
(d2) else, keeping the current row, incrementing the counter of occurrences associated therewith and jumping to step (a);
the training method being stopped when a predetermined stopping criterion is met.

11. The method for classifying an observation according to claim 9, wherein, for each area:
said area comprises a number of J rows with associated counters of occurrences not equal to zero,
the reading of the output lines associated with said number of J rows is performed in a parallel manner.

* * * * *